(12) United States Patent
Curtin et al.

(10) Patent No.: US 7,614,342 B2
(45) Date of Patent: Nov. 10, 2009

(54) SQUEEGEE BLADE HOLDERS WITH INTEGRAL CLEANING APPARATUS

(76) Inventors: Mark Curtin, 47-584 Ahuimanu Rd., Kaneohe, HI (US) 96744; Thomas B. Feeney, 31 Birch Ridge Trail, Nashua, NH (US) 03062

( * ) Notice: Subject to any disclaimer, the term of this patent is extended or adjusted under 35 U.S.C. 154(b) by 281 days.

(21) Appl. No.: 11/395,063

(22) Filed: Mar. 31, 2006

(65) Prior Publication Data
US 2007/0062386 A1   Mar. 22, 2007

Related U.S. Application Data

(60) Provisional application No. 60/667,359, filed on Apr. 1, 2005.

(51) Int. Cl.
*B05C 17/04* (2006.01)
*B41F 35/00* (2006.01)
(52) U.S. Cl. ........................ 101/123; 101/425
(58) Field of Classification Search ............. 101/123, 101/124, 425
See application file for complete search history.

(56) References Cited

U.S. PATENT DOCUMENTS

| 3,071,069 | A | * | 1/1963 | Sherman ................ 101/123 |
|---|---|---|---|---|
| 4,146,484 | A | | 3/1979 | Campbell |
| 4,273,655 | A | | 6/1981 | Reid |
| 4,498,988 | A | | 2/1985 | Fujita et al. |
| 5,461,781 | A | | 10/1995 | Pirc |
| 5,550,622 | A | | 8/1996 | Tange |
| 5,802,970 | A | | 9/1998 | Tani |
| 6,022,192 | A | | 2/2000 | DeLaHoz et al. |
| 6,640,712 | B2 | | 11/2003 | Corti et al. |
| 6,659,002 | B2 | * | 12/2003 | Langdon et al. ............. 101/123 |
| 6,698,346 | B2 | | 3/2004 | Shimizu et al. |

FOREIGN PATENT DOCUMENTS

JP          11198347 A   *   7/1999

* cited by examiner

*Primary Examiner*—Ren Yan
(74) *Attorney, Agent, or Firm*—O'Connell Law Firm

(57) ABSTRACT

A printing system including a squeegee and a blade assembly. The system further includes moving paste retainers and at least one cross elements. The cross elements include one or more cross wires to affect a wiping action of the blade during a printing cycle of the squeegee. The motion of the paste retainers and cross elements created by pivoting paste retainers. The wire motion is set on an arc at a fixed radius from a pivot point, and arc traversing a significant part of a front face of the squeegee inside of solder paste or viscous material mass. The cross elements include multiple cross wires or thin blades to affect more shearing action with less motion.

13 Claims, 7 Drawing Sheets

SQUEEGEE BLADE HOLDERS WITH INTEGRAL CLEANING APPARATUS

PRIORITY INFORMATION

This application claims the benefit of U.S. Patent Application Ser. No. 60/667,359 filed on Apr. 1, 2005.

BACKGROUND OF THE INVENTION

There are a growing assortment of printed materials used throughout industry and especially in Electronics Manufacturing. Currently there are a host of new solder paste formulations, which happen to express high levels of adhesion to their own mass or to surrounding printing components such as metal squeegees and stencil surfaces.

A significant problem is maintaining solder paste in a known preferred position inside the printing machine. Normally, it is highly desired to have the solder paste remain in a cylinder shape, approximately 1.0 to 1.5 inches in diameter. This mass of paste is transferred back and forth across a stencil surface, by alternating action of two squeegees. Typically, the solder paste does not remain in the ideal cylinder geometry, but rather becomes distorted, and stretched out when each squeegee finishes its printing stroke and raises up in the clearance position. This results in a loss of quality and dependability: the main solder paste mass, after adhering to one squeegee may be depleted of enough quantity to print again. The paste which adheres to the squeegee results in undesirable drying. It is thus most desirable to maintain the solder paste in the minimum area of surface exposure and contact with machine elements.

SUMMARY OF THE INVENTION

A printing system including a squeegee holder and blade assembly which have been adapted to have articulating side retainers and at least two cross wires to affect the removal of solder paste from the squeegee blade during each print stroke. The articulating side retainers are located at each end of the squeegee blade holder and are connected with a cross bar. Both end paste retainers pivot around a point, and a line drawn between two pivot points form a parallel line to the tip of the squeegee blade. The two pivoting paste retainers move in synchronization. Two wires are drawn tight between each pivoting paste retainer. The arrangement of these elements enables a wiping action to occur which improves the printing of viscous materials and solder paste by removing the material from the squeegee blade after the print stroke of each squeegee.

The actuation of the wire and side retainers is accomplished by one of several variations. The wires may alternatively be heated, to improve the shearing and cleaning action. The motion of the moving paste retainer may be pivoting, or linear, or by a linkage arrangement, and the actuation may be controlled to affect a certain acceleration of the wire which improves the wiping action. The wire may be moved quickly with a snapping action to produce a more clean shearing action.

It is an object of the invention to provide a squeegee holder and blade assembly which remove the unused solder paste after each passage of the squeegee over the substrate that is being printed.

It is another object of the invention to control the speed and angle of the cross elements depending on the paste being used to print.

Other features and advantages of the present invention will now be described in greater detail with reference to the accompanying drawings, wherein:

DESCRIPTION OF THE INVENTION

Figure 1:
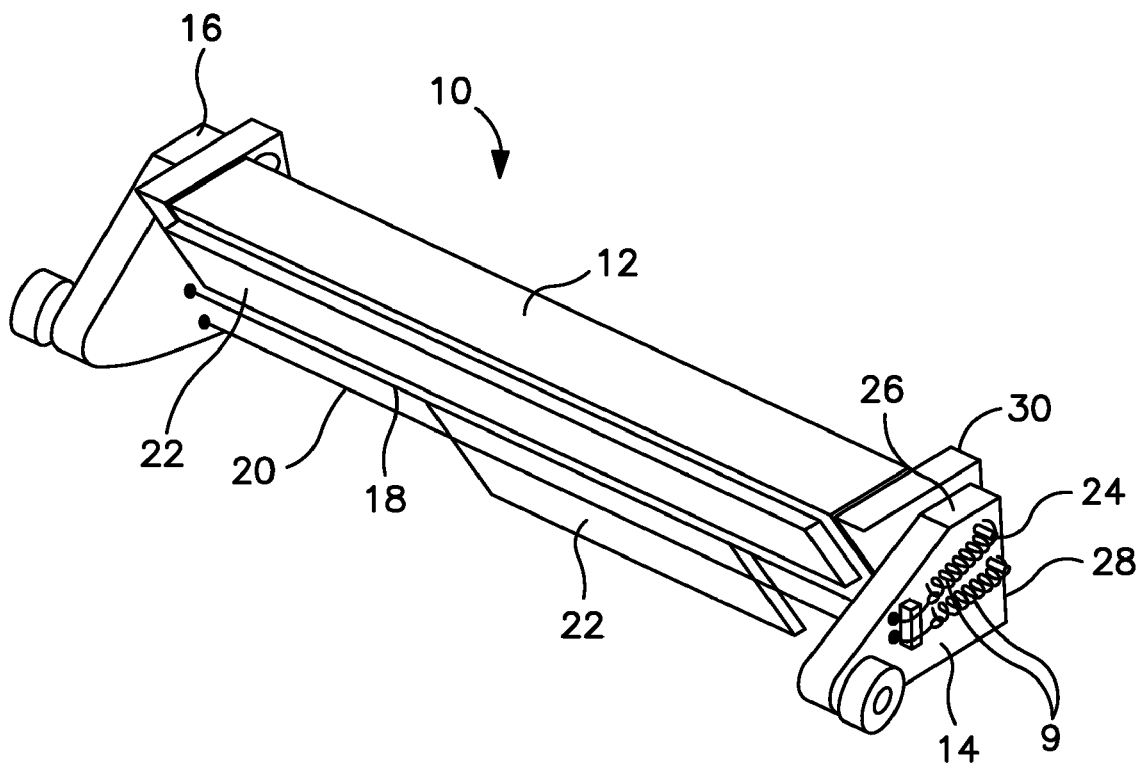
FIG. 1 is a perspective view of one squeegee holder configured in accordance with the invention.

As shown initially at 10 in FIG. 1, a squeegee holder and blade assembly 12 in a printing system have been adapted to have articulating side retainers 14, 16 and two cross wires 18, 20 (upper and lower, respectively) to affect the removal of solder paste from the squeegee blade 22 during each print stroke. Two wires 14, 16 are described, but there could be only one wire, or more than two wires. The articulating side retainers 14, 16 are located at each end of the squeegee blade holder 12, and are connected with a cross bar 24. Both end paste retainers pivot around a point 26, and a line 28 drawn between two pivot points form a parallel line to the tip of the squeegee blade. The two pivoting paste retainers move in synchronization as they are connected by a cross bar 24. Two wires of approximately 0.03 inches diameter (other wire sizes may be utilized depending on the material which is being printed) are drawn tight between each pivoting paste retainer, and is held taught by a spring 9 at one end of each wire. The arrangement of these elements enables a wiping action to occur which improves the printing of viscous materials and solder paste by removing the material from the squeegee blade 22 after the print stroke of each squeegee. A pivot mounting element 30 allows for the pivoting to occur and a square clamp bar 32 hold the squeegee blade.

FIGS. 4A-D illustrate the four positions of a dual squeegee printer. The pivoting paste retainers tilt causing the wires to move down, thus shearing off the solder paste.

The actuation of the wire and side retainers is accomplished by one of several variations: a) by the up-down motion of the squeegee holder and corresponding contact between the pivoting paste retainer and stencil surface or b) by a separate actuator which is turned on and off electronically through a built in switch attached to the squeegee holder, or by the control software of the printing machine, or c) by interaction with the opposing squeegee holder and paste retainer assembly, during the up motion of the squeegee. The wires may alternatively be heated, to improve the shearing and cleaning action. The heating could also be turned on and off by a switch or by the machine's control software. The motion of the moving paste retainer may be pivoting, or linear, or by a linkage arrangement, and the actuation may be controlled to affect a certain acceleration of the wire which improves the wiping action. For example, the wire may be moved quickly with a snapping action (varying acceleration profile) which produces a more clean shearing action. The above mentioned actuation may be initiated at optimal points in the squeegee motion cycle to improve the release of the viscous material. The point in the cycle for actuation is immediately at the end of the squeegee stroke at the beginning of the squeegee up motion. At this point, the solder paste is still touching the stencil surface, and it is beneficial to initiate the wiping action at this time to enhance the viscous material removal, since it is already touching and being pulled from the squeegee by adhesion to the stencil surface.

The combination of the squeegee holder and the blade assembly shears the solder paste mass, by means of two wires, which pivot an arc. The wires and arc motion create a "cutting surface" which is designed to fall in front of the squeegee blade. At the end of the pivot motion, one wire moves into contact with the tip of the squeegee blade, thereby cutting off the solder paste and causing the solder paste mass to fall down onto the stencil surface. This timing is important, because during printing, the squeegee and solder paste form a stable rolling action, and any disturbance would likely disturb the quality of the printed pattern. At the end of the printed stroke, normally the squeegee is retracted in a vertical separation from the stencil plane. At this point in the printing cycle, the paste separates irregularly, forming a wide area disposed between the squeegee surface, the space between the squeegee and the stencil, and around the stencil. Shortly thereafter, the second squeegee actuates, and if there is paste dripping from the first squeegee onto the stencil surface, this can cause a premature contamination in the print area-resulting in defective or rejected electronics assemblies.

Figure 2:
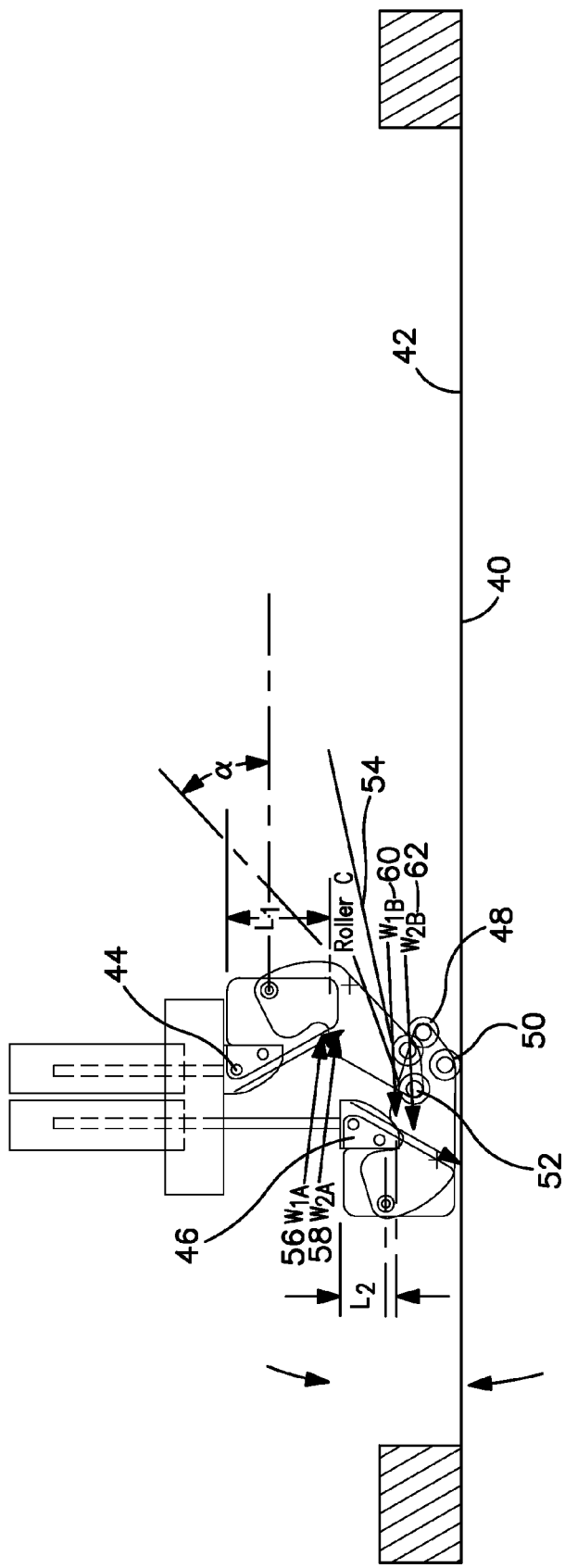
FIG. 2 is a side view of a dual squeegee print head showing the range of motion of pivoting retainers and cross wires.

As shown in FIG. 2, a pc board 40 is printed on using a stencil foil 42. In this figure there are two squeegee holders, 44 in the down position and 46 in the up position. The squeegee blade and holder initiate motion across the stencil foil 42. Dual wire positions shown in the down cutoff position near the tip of the squeegee blade when not in use and in the up printing position in active printing squeegee. Rollers 48 and 50 of squeegee holder 46, attached to pivoting paste retainer of the holder, may work in contact with rollers 52 and 54 of squeegee holder 44. Squeegee holder 44 may provide more positive force to return the angled position similar to the mirror image of squeegee holder 44. Each squeegee holder 44 and 46 have two wires, 56, 58 and 60 and 62, respectively.

Figure 5:
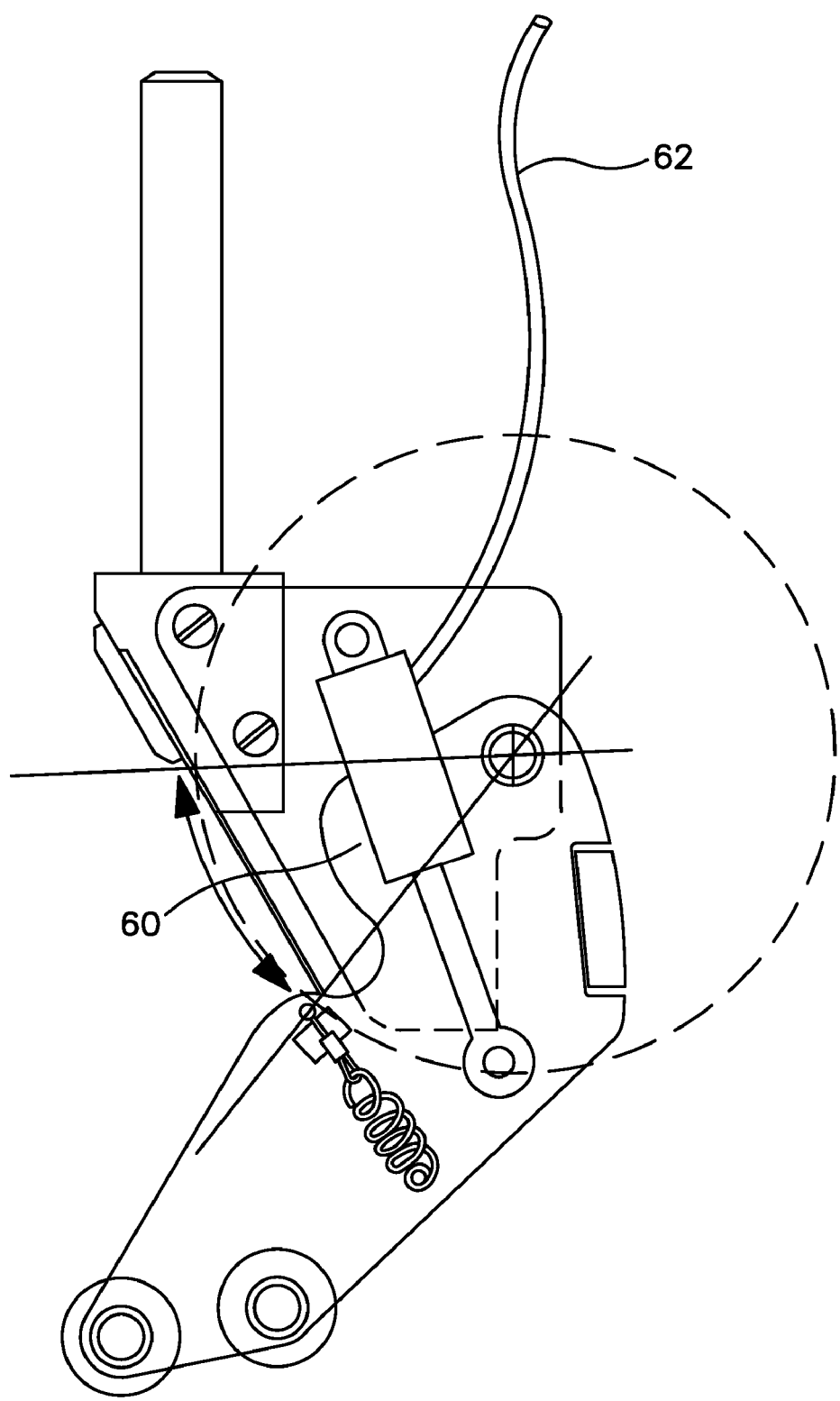
FIG. 5 is a partial side view of holder wherein an actuator is driven by an air source.

This procedure is unique in affecting maximum utility with minimum additional components by adapting a squeegee holder with four simple elements: (1) two moving paste retainers, (2) two thin wires (3) two springs to tension the wire, and (4) a cross-bar securing the two pivoting paste retainers so they rotate in synchronization. The actuation of the moving paste retainers and wire assembly may be accomplished passively, by interference between the moving paste retainer element, and a fixed part of the printing machine internal space. The moving paste retainer is actuated by contact with the stencil surface, during the squeegee holder's up or down motion. Alternatively, a separate actuator may be used. Other variations of linkages may be used, and activation may be caused by squeegee-to-squeegee interaction and these variations should be considered part of this invention. Optimal speed/acceleration control of the moving wire are also part of this invention. These movement profiles may be adjusted depending on the viscosity of the material and it's plastic behavior. FIG. 5 shows one such variation as the actuator 60 is driven via an air source 62.

Figure 3A:
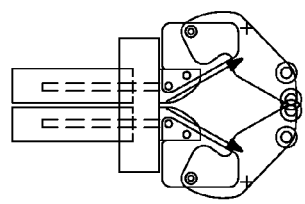
FIGS. 3A and 3B illustrate the squeegee holders in an up and down position, respectively.
Figure 3B:
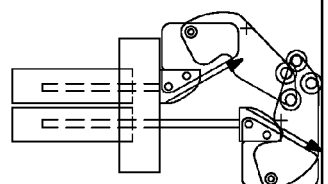
Figure 4A:
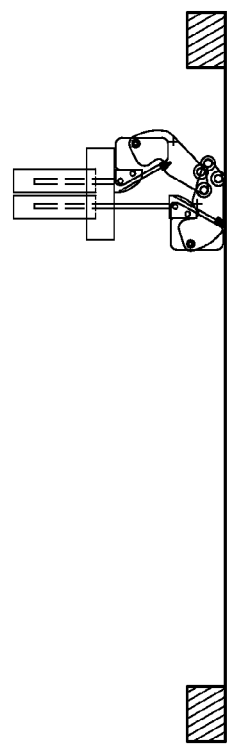
FIGS. 4A-D illustrate the 4 positions of one squeegee in a dual squeegee printer.
Figure 4B:
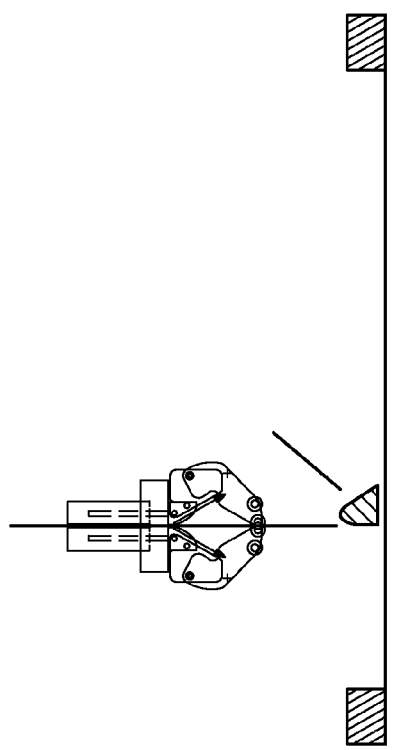
Figure 4C:
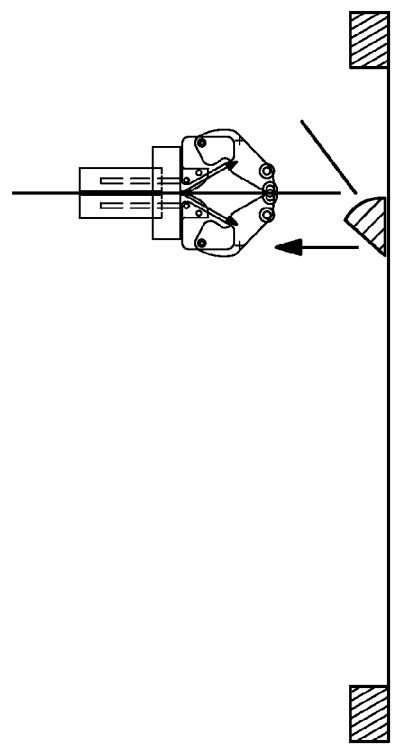
Figure 4D:
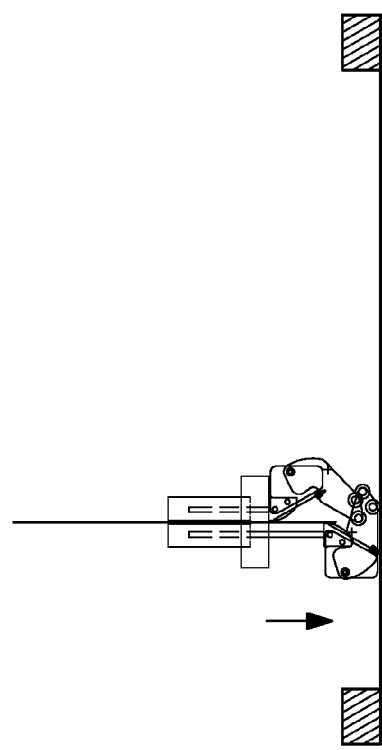

FIGS. 3A and 3B show the different positions of the pivoting paste retainers with respect to the up and down squeegee positions and shows roller contact with the stencils surface.

The use of thin wires, causes the solder paste to have little or no surface to adhere to. The minimal nature of the wire, for example, for a 12 long wire, 0.03 in diameter, the total additional surface area introduced into the viscous material is: 1.1304 square inches, compared to a typical squeegee blade surface area of 1.25 wide×12 long, which equals: 15 square inches. Thus the small additional surface area of the wire crossing through the solder paste, offers a cleaning system which does not become saturated and clogged by the printed material. Further, an internal spring maintains tension on the wire, so that there is a predetermined "give" to allow the wire to absorb temporary changes in viscosity or friction due to the varying behavior of the solder paste, and to provide a spring load to the bearing elements which produces an anti-backlash rotation which is less subject to positional variation.

While traditional paste retainers may be modified to be pivoting and may be used to hold the two wires, it is preferred to add two new pivoting paste retainers, and to keep them out at the ends of the squeegee, away from the printing material. In this arrangement, the traditional fixed paste retainers would serve to keep the mass of solder paste contained in the print area, and the pivoting paste retainers could serve to move the wire. The fixed paste retainers need to be modified with a slot to allow the two cross wires to rotate on an arc without interference. A small slotted piece of rubber sheet is mounted to the inside of the fixed paste retainer to prevent solder paste from leaking out of the slot.

Figure 6:
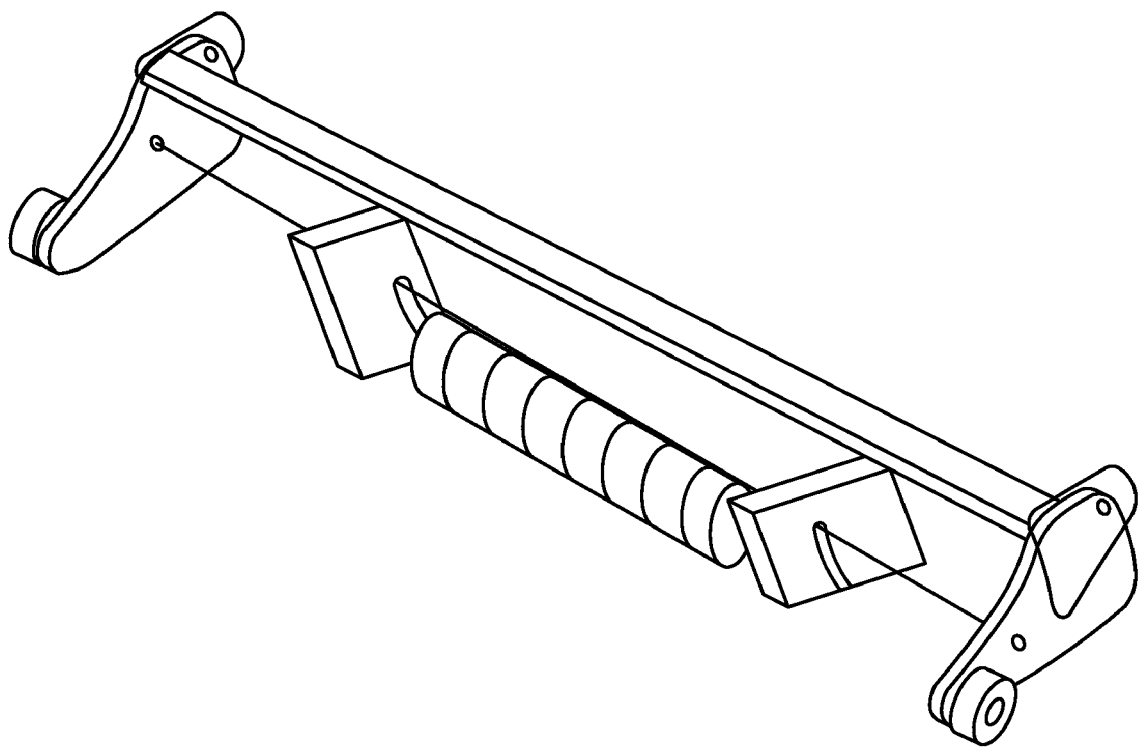
FIG. 6 is a partial view of a squeegee holder with a traditional fixed paste retainer with slots located at the ends of the squeegee blade.
Figure 7:
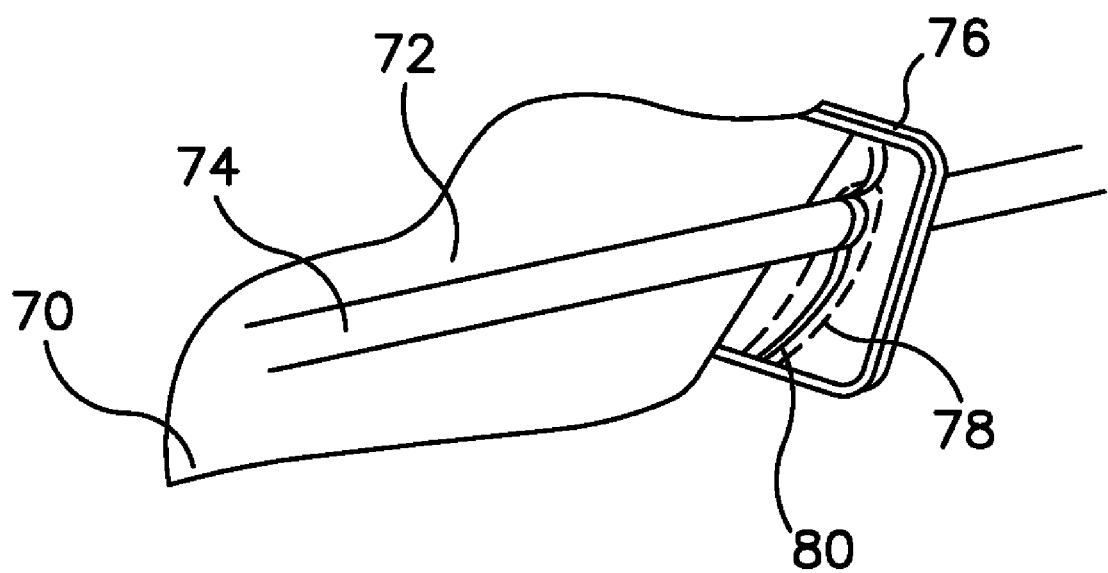
FIG. 7 is a partial view of a latex seal with a slot to allow passage of the wire.

FIG. 6 is a partial view of a squeegee holder with traditional fixed paste retainers having slots located at the ends of the squeegee blade. This design keeps the paste away from the pivoting elements to improve their operation and avoid paste contamination. Also, FIG. 7 illustrates a latex seal with a slot to allow the wires to pass through while sealing paste to the inside surface. A squeegee blade 70 is shown along with upper and lower wires 72 and 74. A fixed paste retainer 76 includes a slot 78 fixed therein. A latex skin 80 has a slice to close and seal paste to the inside of paste retainer 76 while allowing the passage of wires.

The suspension of a thin wire across and in front of the squeegee blade allows only minimal additional surface area, yet this wire is held tight and offers a rigid low surface area moving element which shears the solder paste without providing excessive area for the solder paste to adhere to. The speed and motion control of the wire, either in a passive arrangement, or by actuation of linkage design are unseen in this industry and this aspect of the invention causes a high value result with minimal components of equipment change. The nature of the invention, being an adaptation of a squeegee holder allows this new design to be implemented across a wide range of equipment through adaptation of only the squeegee holder. Adding a heated wire, produces an enhanced shearing action, with only the addition of a power supply, and switch to turn the wire on and off. A simple resistive wire and rechargeable may be used to affect the heating. This heating option is beneficial compared to heating other elements such as the squeegee blade itself. By heating the wire, and moving the heated wire, only a minimal amount of solder paste of viscous material is heated (that material which is in close proximity to the thin wire). This is important, because if the solder paste or viscous material receives too much heat, it change characteristics and may not perform well in the printing process.

The system includes multiple cross wires or thin blades to affect more shearing action with less motion. For example, if two wires are used then the rotation causes the same amount of arc to be traversed, and therefore, gives the same shearing area as a single wire moving the full arc angle.

In this system, the moving paste retainers are set at the outside ends of the squeegee holder, and the blade is inset. A second pair of fixed paste retainers maybe positioned at the ends of the squeegee blade. The paste retainers have slots to allow the moving wiping wires to pass within them. The fixed paste retainers have a latex skin of about 0.05 inches thick and the skin is sliced. The size of the skin may be altered depending on the specific printing process being used. This skin prevents solder paste from leaking out of the slot through which the wires pass and reciprocate.

It will be apparent to those skilled in the art that the present invention may be embodied in may other specific forms without departing from the spirit or scope of the invention. Therefore, the present embodiment is to be considered as illustrative and not restrictive and the invention is not to be limited to the details given herein, but may be modified within the scope of the appended claims.

What is claimed is:

1. A printing system to print solder paste or other viscous material, the printing system comprising a squeegee holder and blade assembly with a squeegee holder and a blade, movable retainers retained to move in relation to the squeegee holder and blade assembly, at least one cross element retained by the movable retainers, means for inducing an actuation of the movable retainers and the at least one cross element wherein the at least one cross element includes one or more cross wires to effect a wiping action of the blade during a squeegee stroke of a printing cycle of the squeegee holder and blade assembly when the movable retainers and the at least one cross element are actuated.

2. The system of claim 1 wherein the movable retainers and at least one cross element pivot about a pivot point through an arc when actuated thereby to create a pivoting movement of the one or more cross wires along an arc at a fixed radius from the pivot point wherein the arc traverses a significant portion of a front face of the squeegee whereby the one or more cross wires passes inside of a solder paste or viscous material mass retained relative to the squeegee holder and blade assembly.

3. The system of claim 2 wherein there are multiple cross elements retained by the movable retainers.

4. The system of claim 2 further comprising a means for heating the one or more cross wires.

5. The system of claim 4 wherein the means for heating the one or more cross wires is activated by an electronic switch or by a machine controlled computer timed to heat the one or more cross wires at the end of the squeegee stroke.

6. The system of claim 2 wherein the means for inducing an actuation of the movable retainers and the at least one cross element actuates movement of the movable retainers and the at least one cross element at the end of the squeegee stroke of the printing cycle.

7. The system of claim 2 wherein there are multiple squeegee holders with a first squeegee holder that is larger than a second squeegee holder.

8. The system of claim 2 wherein there are multiple squeegee holders with a first squeegee holder staggered in relation to a second squeegee holder.

9. The system of claim 1 wherein the movable retainers move linearly in relation to the squeegee holder and blade assembly.

10. The system of claim 1 wherein the movable retainers and at least one cross element are moved by a linkage arrangement.

11. The system of claim 1 the means for inducing an actuation of the movable retainers and the at least one cross element comprises independent actuators.

12. The system of claim 1 wherein the means for inducing an actuation of the movable retainers and the at least one cross element has a speed acceleration profile.

13. The system of claim 1 wherein the movable retainers are positioned adjacent to outside ends of the squeegee holder further comprising a pair of fixed paste retainers positioned adjacent to ends of the squeegee blade wherein the fixed paste retainers have slots to receive the one or more cross wires, and further comprising a skin fixed to the fixed paste retainers, wherein said skin is sliced preventing solder paste from leaking out of the slots.

* * * * *